(12) United States Patent
Oh et al.

(10) Patent No.: US 12,507,441 B2
(45) Date of Patent: Dec. 23, 2025

(54) THIN FILM TRANSISTOR AND DISPLAY PANEL HAVING THE SAME

(71) Applicant: LG Display Co., Ltd., Seoul (KR)

(72) Inventors: Kum-Mi Oh, Paju-si (KR); Deuk-Ho Yeon, Paju-si (KR); Sun-Wook Ko, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 495 days.

(21) Appl. No.: 18/055,337

(22) Filed: Nov. 14, 2022

(65) Prior Publication Data

US 2023/0215956 A1 Jul. 6, 2023

(30) Foreign Application Priority Data

Dec. 31, 2021 (KR) ........................ 10-2021-0193789

(51) Int. Cl.
*H01L 29/786* (2006.01)
*H10D 30/67* (2025.01)
*H10D 86/40* (2025.01)
*H10D 86/60* (2025.01)
*H10K 59/121* (2023.01)

(52) U.S. Cl.
CPC ..... *H10D 30/6757* (2025.01); *H10D 30/6729* (2025.01); *H10D 86/40* (2025.01); *H10D 86/60* (2025.01); *H10K 59/1213* (2023.02)

(58) Field of Classification Search
CPC .......... H10D 30/6757; H10D 30/6715; H10D 30/67; H10D 30/6729; H10D 30/6734; H10D 86/40; H10D 86/60; H10D 86/421; H10D 62/10; H10D 62/124; H10D 62/235; H10D 62/17; H10D 30/637; H10K 50/00; H10K 50/805; H10K 50/81; H10K 50/916; H10K 59/121; H10K 59/00; H10K 59/131; H10K 59/123; H10K 59/1213; H01L 25/0753; H01L 25/18; H01L 25/167
See application file for complete search history.

(56) References Cited

U.S. PATENT DOCUMENTS

| 6,426,517 | B2* | 7/2002 | Hayakawa | ........... H10D 30/673 257/E27.111 |
| 9,202,849 | B2* | 12/2015 | Lee | ........................ H10K 59/00 |
| 9,478,169 | B2* | 10/2016 | Lim | ..................... G09G 3/3233 |
| 2001/0000627 | A1* | 5/2001 | Hayakawa | ........... H10D 30/673 438/149 |

(Continued)

FOREIGN PATENT DOCUMENTS

| CN | 111540780 A | 8/2020 |
| KR | 20060032827 A | 4/2006 |

(Continued)

*Primary Examiner* — Nikolay K Yushin
(74) *Attorney, Agent, or Firm* — Seed Intellectual Property Law Group LLP

(57) ABSTRACT

A thin film transistor and a display panel having the same are provided. A display panel includes a substrate, an active layer disposed over the substrate and including a source region, a drain region, and a middle region between the source region and the drain region, and a gate electrode over the active layer and disposed overlapping with the middle region, and the active layer includes a plurality of holes disposed symmetrically with respect to the middle region. The display panel can improve its reliability owing to heat dissipation paths through the plurality of holes.

20 Claims, 6 Drawing Sheets

(56) References Cited

U.S. PATENT DOCUMENTS

| | | | |
|---|---|---|---|
| 2013/0043479 A1 | 2/2013 | Kim et al. | |
| 2014/0306191 A1* | 10/2014 | Lee | H10D 30/6746 257/40 |
| 2015/0129844 A1 | 5/2015 | Kang et al. | |
| 2016/0104424 A1* | 4/2016 | Lim | G09G 3/3258 345/76 |
| 2021/0020662 A1 | 1/2021 | Ishida et al. | |
| 2021/0305341 A1 | 9/2021 | Seo et al. | |

FOREIGN PATENT DOCUMENTS

| | | |
|---|---|---|
| KR | 101126448 B1 | 3/2012 |
| KR | 10-2016-0002352 A | 1/2016 |
| KR | 20170053780 A | 5/2017 |
| KR | 20200032405 A | 3/2020 |
| KR | 20210085218 A | 7/2021 |
| KR | 20210104225 A | 8/2021 |

* cited by examiner

THIN FILM TRANSISTOR AND DISPLAY PANEL HAVING THE SAME

CROSS-REFERENCE TO RELATED APPLICATIONS

This application claims the priority benefit of Korean Patent Application No. 10-2021-0193789, filed in the Republic of Korea on Dec. 31, 2021, the entire contents of which are expressly incorporated herein by reference in its entirety into the present application.

BACKGROUND

Technical Field

The present disclosure relates to a thin film transistor, and more specifically, to a thin film transistor that can generate high driving current and/or improves its reliability and a display panel including the thin film transistor.

Description of the Related Art

A flat panel display device such as a liquid crystal display device (LCD), an organic light emitting display device (OLED) and a quantum dot display device (QD) has been widely used in various applications. Among those display devices, the OLED and QD include a plurality of electroluminescence elements disposed on a substrate for implementing images and a driving element providing driving signal or driving current with each of the electro-luminescence elements and disposed on the substrate so that the driving element can control each of the electro-luminescence elements to emit light and can display images interpreted from information sequences to the substrate.

Since the LCD is not a self-luminous type, a back-light unit should be disposed on a back side of the LCD in order to emit light. The back-light unit causes a thickness of the LCD to be increased, and thus, the LCD has a limitation in implementing a display device with various types of designs such as a flexible-type, or a circular type, and the LCD may have low luminance and response speed.

Since the display device with the self-luminous element can be implemented thinner than the display device including a light source, it can realize a flexible and/or foldable display device. The display device with the self-luminous element may include an organic light-emitting display device which includes an organic material as an emissive layer and an inorganic light-emitting display device in which includes an inorganic material as an emissive layer. Since the display device with the self-luminous element such as the organic light-emitting display device and the inorganic light-emitting display device does not need any separate light source, it can be utilized as various types of display devices with further thinner thickness.

However, the organic light-emitting display device using organic materials are susceptible to moisture and oxygen penetrating into the emissive layer, which results in pixel defects such as oxidation between the organic emissive layer and electrodes. Accordingly, various technical components for minimizing or reducing the penetration of oxygen and moisture are beneficial in the organic light-emitting display device.

Recently, research and development for a display device using an inorganic light-emitting element have been conducted. Since the inorganic display device has high image quality and high reliability, those display devices have attracted much attention as a next-generation display device.

BRIEF SUMMARY

Accordingly, embodiments of the present disclosure are directed to a thin film transistor and a display panel that substantially obviate one or more of the problems due to the limitations and disadvantages of the related art.

An aspect of the present disclosure is to provide a driving element that generates a high driving current stably and/or improves its reliability and a display panel including the driving element.

To achieve these and other aspects of the technical concepts, as embodied and broadly described, the present disclosure provides a display panel that includes a substrate, an active layer disposed over the substrate and including a source region, a drain region and a middle region between the source region and the drain region, and a gate electrode over the active layer disposed overlapping with the middle region, wherein the active layer includes a plurality of holes disposed symmetrically with respect to the middle region. It is possible to improve the reliability of the display panel owing to heat dissipation paths through the plurality of holes.

In another aspect, the present disclosure provides a thin film transistor that includes an active layer including a source region, a drain region, at least two channel regions and a non-channel region, a gate electrode disposed over the active layer and overlapping with the channel regions and the non-channel region, a source electrode electrically connected to the source region, a drain electrode electrically connected to the drain region, wherein the channel regions and the non-channel regions are arranged alternately. The thin film transistor can generate high driving current due to the at least two channel regions. The present disclosure also provides a display panel including the thin film transistor.

Additional features and aspects will be set forth in the description that follows, and in part will be apparent from the description, or can be learned by practice of the technical concepts provided herein. Other features and aspects of the technical concept can be realized and attained by the structure particularly pointed out in the written description, or derivable therefrom, and the claims hereof as well as the appended drawings.

It is to be understood that both the foregoing general description and the following detailed description are examples and explanatory and are intended to provide further explanation of the technical concepts as claimed.

BRIEF DESCRIPTION OF THE SEVERAL VIEWS OF THE DRAWINGS

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION

Figure 1:
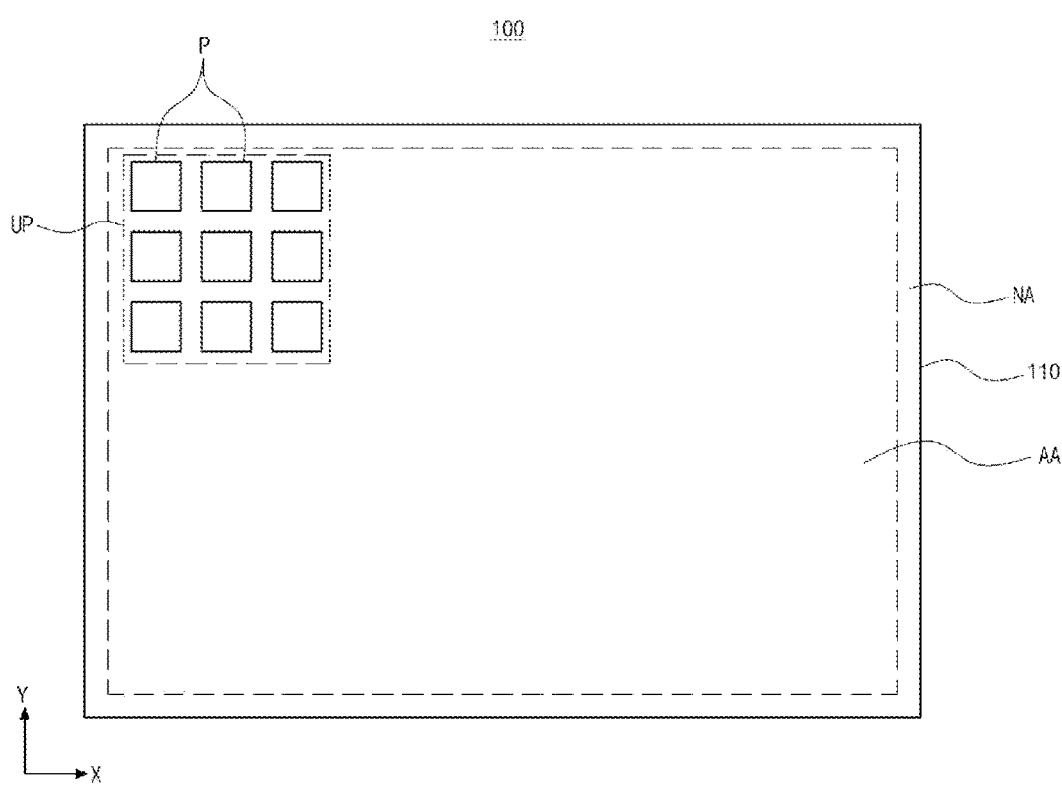
FIG. 1 is a plain view illustrating schematically a display panel in accordance with one example aspect of the present disclosure.

Advantages, features and processes or steps for implementing them of the present disclosure will become apparent with reference to embodiments described below in detain in conjunction with the accompanying drawings. However, the present disclosure is not limited to the embodiment described below, but will be implemented in a variety of different forms. Those embodiments only allow the present disclosure are provided only to complete the present disclosure and to fully inform those of ordinary skill in the art to which the present disclosure belongs.

Since the shape, size, ration, angle, number, etic illustrated in the drawing for describing the embodiments of the present disclosure are examples, the present disclosure is not limited to the specific structure or shape illustrated in the drawing. Identical reference numerals refer to identical elements through the present disclosure. In addition, in describing the present disclosure, if it is determined that a detailed description of a related known art may unnecessarily obscure the subject matter of the present disclosure, the detailed description thereof will be omitted. As used herein, when a term such as "including," "having" or "comprising," other elements may be added unless 'only' is used.

When an element is expressed in a singular, plural elements are included otherwise explicitly described. In interpreting elements, it is interpreted as including an error range otherwise explicitly described.

In case of describing the positional relationship, for example, when the positional relationship of two elements is described as "on," "over," "under," "next to" and the like, one or more other elements can be placed between two element unless "directly" or "adjacent" is used. In case of describing the temporal relationship, for example, when temporal precedent relations is described as "after," "next," "before" and the like, cases that are not-continuous may be included unless "directly" or "immediately" is used.

Each of features of the various embodiments of the present disclosure may be partially or wholly combined or combined with each other, technically linked and implemented in various ways, and each of the embodiments may be implemented independently to each other or plural embodiments may be implemented together in an associated relationship.

Reference will now be made in detail to aspects of the disclosure, examples of which are illustrated in the accompanying drawings.

Figure 2:
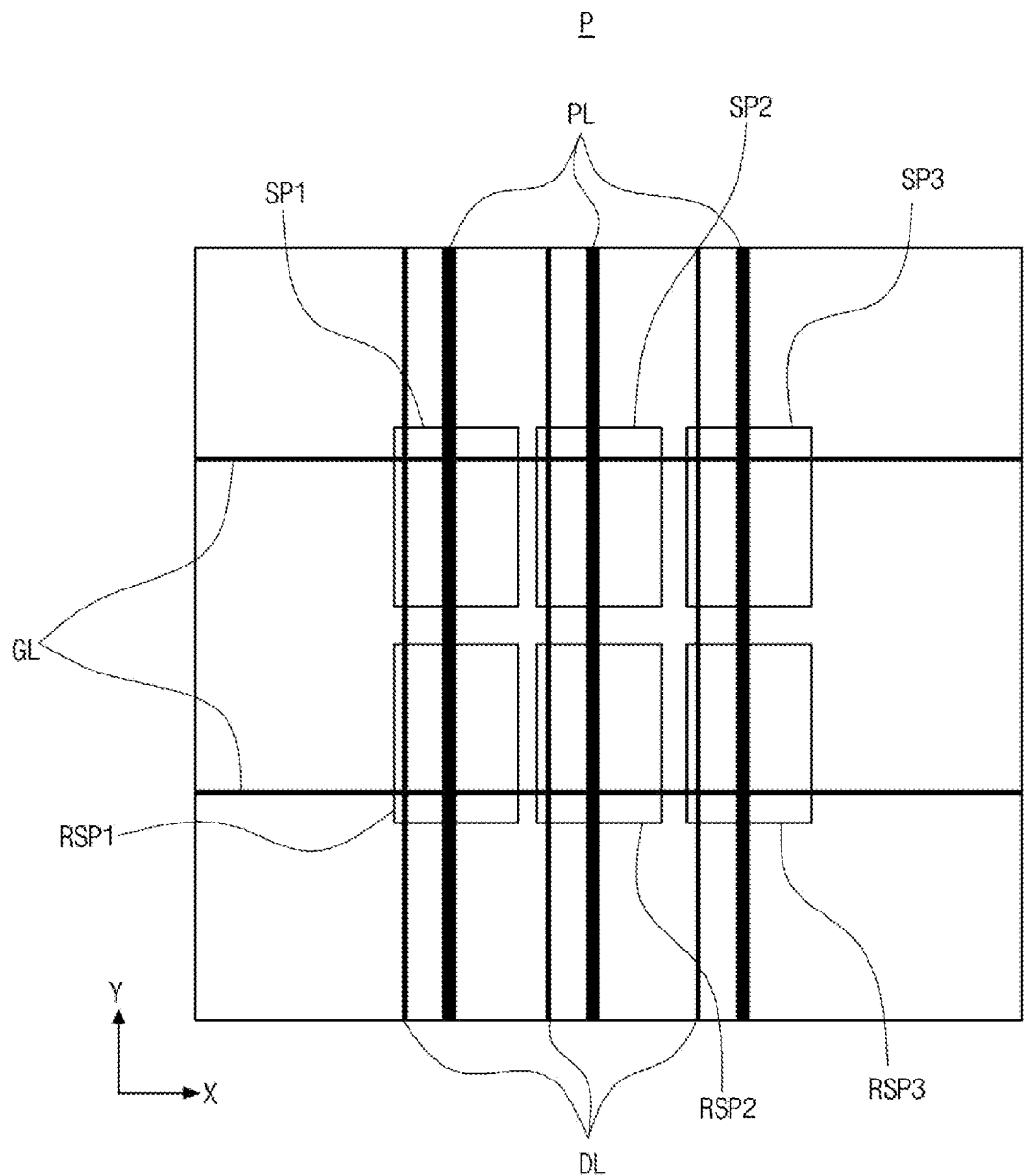
FIG. 2 is a schematic circuit diagram illustrating a pixel and arrangement of signal lines in accordance with one example aspect of the present disclosure.
Figure 3:
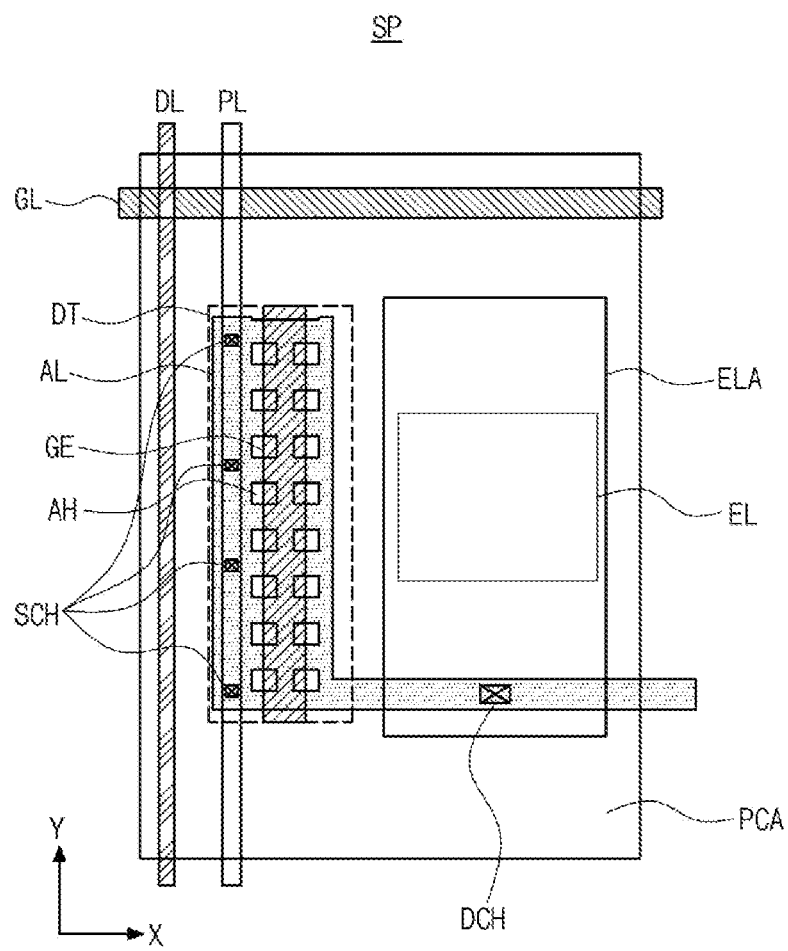
FIG. 3 is a plain view illustrating schematically a sub-pixel in accordance with the present disclosure.

FIG. 1 is s plain view illustrating schematically a display panel in accordance with one example aspect of the present disclosure. FIG. 2 is a schematic circuit diagram illustrating a pixel and arrangement of signal lines in accordance with one example aspect of the present disclosure. FIG. 3 is a plain view illustrating schematically a sub-pixel in accordance with the present disclosure.

A display panel 100 in accordance with an example aspect of the present disclosure includes a substrate 110 including a display area AA in which a plurality of pixels P are arranged and a non-display area NA. The plural pixels P may be divided by a predetermined or selected number into a unit pixel UP. The unit pixel UP is one unit including a certain number of pixel(s) P. The unit pixel UP is one unit or group that can be applicable differently in display compensation or physical structure. As a unit or group, the number of pixels P included in the unit pixel UP may be applied differently depending on the cases.

Referring to FIG. 2, the pixel P may include plural sub-pixels SP, and more particularly, include, but is not limited to, sub-pixels SP1, SP2 and SP3 each of which emits light of red color, blue color and green color, respectively, and optionally include sub-pixels emitting light of white color, and the like. In addition, the pixel P may include a plurality of redundancy sub-pixels RSP1, RSP2 and RSP3 each of which corresponds to the sub-pixels SP1, SP2 and SP3, respectively. The red redundancy sub-pixel RSP1 may be arranged parallel with the red sub-pixel SP1 along a Y-axis, the blue redundancy sub-pixel RSP2 may be arranged parallel with the blue sub-pixel SP2 along the Y-axis and the green redundancy sub-pixel RSP3 may be arranged parallel with the green sub-pixel SP3 along the Y-axis. The sub-pixels SP1, SP2 and SP3 may be referred to as main sub-pixels. Each of the sub-pixels SP1, SP2 and SP3 and the redundancy sub-pixels RSP1, RSP2 and RSP3, which are arranged parallel along the Y-axis, may include an electro-luminescence element such as an organic light-emitting diode (OLED), a quantum-dot light-emitting diode (QLED), a micro light-emitting diode (micro-LED) and a nano light-emitting diode (nano-LED), and a pixel circuit supplying driving currents for emitting each electro-luminescence element.

The pixel P may further include a plurality of power lines PL and a plurality of data lines DLs each of which extends along the Y-axis and a plurality of gate lines GL extending along an X-axis.

Each of the plural power lines PL is arranged in each of the sub-pixels SP1, SP2 and SP3 and is connected commonly to the main sub-pixels SP1, SP2 and SP3 and the redundancy sub-pixels RSP1, RSP2 and RSP3 each of which is arranged parallel along the Y-axis. For example, the power line PL may include a high potential power line providing a high potential voltage, a low potential power line providing a low potential voltage, an initialization line providing an initial voltage and a reference line providing a reference voltage depending on the pixel circuit.

Each of the plural data lines DL is arranged in each of the sub-pixels SP1, SP2 and SP3 and is connected commonly to the main sub-pixels SP1, SP2 and SP3 and the redundancy sub-pixels RSP1, RSP2 and RSP3 each of which is arranged parallel along the Y-axis. Plural data lines DLs provide data voltages with the pixel circuit.

Each of the plural gate lines GL is arranged in each of the sub-pixels SP1, SP2 and SP3 and is connected commonly to the main sub-pixels SP1, SP2 and SP3 or the redundancy sub-pixels RSP1, RSP2 and RSP3 each of which is arranged parallel along the X-axis. For example, the gate line GL may include at least one scan line providing a scan signal, at least one emission line providing emission signal, and the like depending on the pixel circuit.

The sub-pixel illustrated in FIG. 3 may be one of the main sub-pixels SP1, SP2 and SP3 or the redundancy sub-pixels RSP1, RSP2 and RSP3. The sub-pixel SP includes an emission element layer ELA in which an electro-luminescence element EL is disposed and a pixel circuit area PCA in which the pixel circuit is arranged.

As an example, the electro-luminescence element EL may include, but is not limited to, a light-emitting diode (LED) such as an OLED, a QLED, a micro-LED and a nano-LED. A driving element, which is described below in more detail, may be applied in the display panel 100 in which the light-emitting diode (LED) is used as the electro-luminescence element EL.

The LED element may be a semiconductor light-emitting element using a semiconductor that emits light as the current is applied thereto. The LED element has been widely used in various display devices such as an illuminance, TV, a signage display device and a tiling display device. As an example, the LED element may include an n-type electrode, a p-type electrode and an active layer disposed between those electrodes. Each of the n-type electrode and the p-type electrode may be made of semiconductor material. When the currents flows into the n-type electrode and the p-type electrode, electrons from the n-type electrode and holes from the p-type electrode are recombined in the active layer to emit light.

Since the LED element such as the micro-LED and the nano-LED includes a compound semiconductor such as GaN as an inorganic material, it is possible to inject high current, and thus the LED element can implement high luminance and high reliability owing to low environmental influences such as heat, moisture, oxygen, and the like. In addition, the LED element such as the micro-LED and the nano-LED has about 90% of internal quantum efficiency, which is higher than that in an organic light-emitting diode, so that the LED element can display with high luminance and can implement a display device with low power consumption.

Particularly, there is no need for a separate encapsulation film or an encapsulation substrate to minimize or reduce the penetration of oxygen and moisture in the LED display device including the micro-LED and/or the nano-LED owing to using inorganic materials, unlikely to the OLED display device using the organic material. Therefore, the LED display device has an advantage in that non-display area NA included on the substrate 110 of the display panel 100, which is a margin area that may be generated by disposing the encapsulation film or the encapsulation substrate, can be reduced.

On the other hand, the electro-luminescence element EL such as the LED element benefits from relatively high driving current compared to LCD or OLED display device. The pixel circuit includes the driving element for providing a predetermined or selected current with the electro-luminescence element EL. The electro-luminescence element EL receives driving current from the pixel circuit electrically connected to the electro-luminescence element EL so that the electro-luminescence element EL can emit light.

FIG. 3 illustrates schematically the driving element, providing driving currents with the electro-luminescence element EL, among the pixel circuit arranged in the pixel circuit area PCA. The driving element may be referred to as a driving transistor, a driving thin film transistor or simply a thin film transistor. Hereinafter, it will be described using the term thin film transistor DT as the driving element.

The thin film transistor DT may be arranged parallel to the electro-luminescence element EL in the pixel circuit area PCA. The thin film transistor DT may include an active layer AL, a gate electrode GE, a source electrode, a drain electrode, and optionally a bottom electrode. The source electrode may be connected to the active layer AL through a source contact hole SCH in a source region ALS (FIG. 4) of the active layer AL, and the drain electrode may be connected to the active layer AL through a drain contact hole DCH in a drain region ALD (FIG. 4) of the active layer AL. In this case, the source electrode may be the power line PL, and in this case, the power line PL may be a high potential power line. The drain electrode may be electrically connected to an anode electrode of the electro-luminescence element EL.

As described above, since the electro-luminescence element EL benefits from high driving current, the active layer AL of the thin film transistor DT may be designed to have a modified shape for generating high driving current. As an example, it is possible to increase driving current by designing the active layer AL of which width is larger than the length.

In this case, the length of the active layer AL is a length in the direction in which carriers move, and the carriers move from the source region ALS (FIG. 4) to the drain region ALD (FIG. 4) in the active layer AL. The width of the active layer AL indicates a width of the path along which the carriers move. More particularly, the length and the width of the active layer AL may refer to the length and width of the channel region C (FIG. 5) which is a path along which carriers move. In FIG. 3, the length of the active layer AL means the length along the X-axis direction, and the width of the active layer AL means the length along the Y-axis direction.

However, when the active layer AL is formed to have a width larger than a length, it is difficult for the thin film transistor DT to stably generate an output signal in the driving region, and the reliability of the thin film transistor DT decreases due to heat generation.

In order to solve such a problem, the active layer AL in the thin film transistor DT is designed to have a width longer than a length thereof, and is divided into plural unit layers in the thin film transistor DT in accordance with an aspect of the present disclosure. Accordingly, the thin film transistor DT can generate high driving current so that the display panel 100 can improve its luminance.

In order to divide the active layer AL into plural unit layers, the active layer AL may include a plurality of active layer holes AHs. More particularly, dividing or splitting the active layer AL into plural unit layers means that plural channels are formed in the whole active layer AL. In addition, since heat is not concentrated in the thin film transistor DT due to the active layer holes AHs, heat dissipation pathways can be secured in the thin film transistor DT. The structure of the active layer AL will be described below in more detail.

Figure 4:
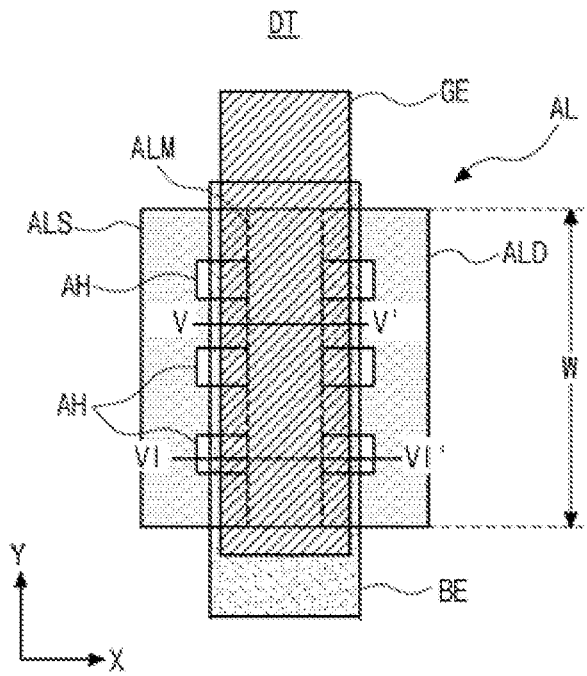
FIG. 4 is a plain view illustrating schematically a thin film transistor in accordance with an example aspect of the present disclosure.
Figure 5:
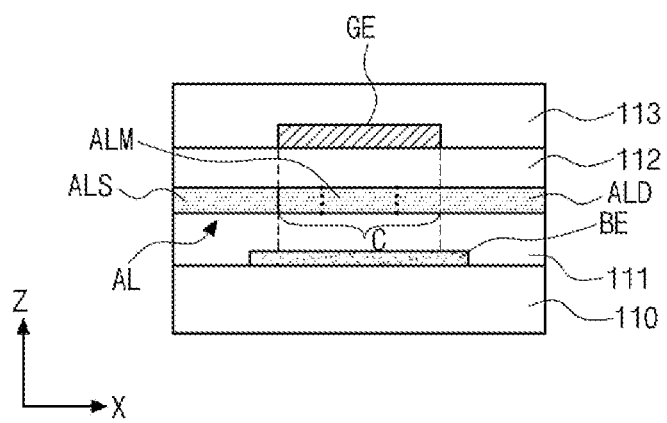
FIG. 5 is a cross-sectional view taken along the V-V' line in FIG. 4.
Figure 6:
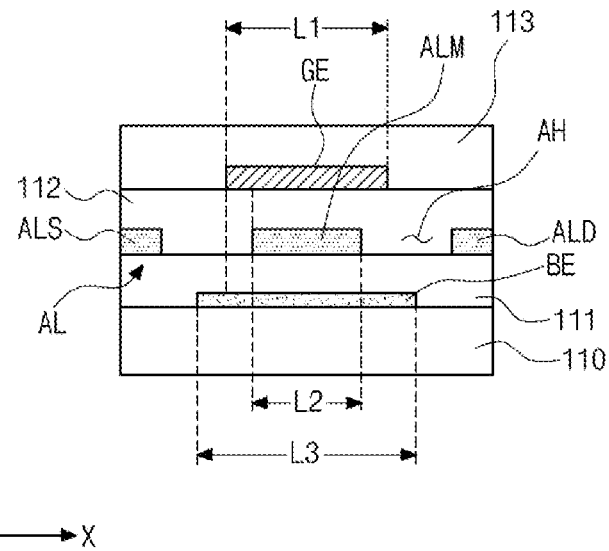
FIG. 6 is a cross-sectional view taken along the VI-VI' line in FIG. 4.

FIG. 4 is a plain view illustrating schematically a thin film transistor in accordance with an example aspect of the present disclosure. FIG. 5 is a cross-sectional view taken along the V-V' line in FIG. 4, FIG. 6 is a cross-sectional view taken along the VI-VI' line in FIG. 4, and a direction of the Z-axis in FIGS. 5 and 6 is perpendicular to directions of the X-axis and the Y-axis shown in FIG. 4.

Referring to FIGS. 4 and 5, a bottom electrode BE is disposed on the substrate 110 and a thin film transistor DT is disposed over the bottom electrode BE. The substrate 110 and the thin film transistor DT may constitute an array substrate. The substrate 110 may be made of plastic material or glass material.

As an example, the substrate 110 may include an obscure or colored polyimide material. In this case, the display panel 100 may further include a back plate connected to a back side of the substrate 110 in order to maintain the display panel 100 in a flat state. The back plate may include plastic material, e.g., polyethylene terephthalate material.

Alternatively, the substrate 110 may be a glass substrate. For example, the glass substrate may be a thin glass substrate with a thickness of about 100 µm or less so that it may have a flexible property. In addition, the substrate 110 may have a laminated structure of two or more substrates or may be divided into two or more layers.

The bottom electrode BE overlaps with the active layer AL and the gate electrode GE each of which is disposed over the bottom electrode BE. When the thin film transistor DT is driven, the channel region C (FIG. 5) is formed in the active layer AL. When the bottom electrode BE is not located under the active layer AL, the lower area of the channel region C is floated and the potential is changed to affect the threshold voltage of the channel, so that it is difficult for the driving element to stably output current. Accordingly, the lower area of the channel region C can be maintained at a constant potential without floating by disposing the bottom electrode BE under the active layer AL and applying a constant voltage to the bottom electrode BE. In addition, the bottom electrode BE can prevent the thin film transistor DT from being deteriorated.

The bottom electrode BE may be made of semiconductor such as silicon-based material or conductive material such as molybdenum (Mo), aluminum (Al), chrome (Cr), gold (Au), titanium (Ti), nickel (Ni), neodymium (Nd) and/or copper (Cu), or an alloy thereof. The bottom electrode BE may have a single-layered structure or a multi-layered structure.

A first insulating layer 111 is disposed on the bottom electrode BE. The first insulating layer 111 may be disposed over the whole area of the substrate 110 to insulate the bottom electrode BE from the active layer AL. The first insulating layer 111 may have a single- or multi-layered structure of an inorganic insulating material such as silicon oxide ($SiO_x$) and/or silicon nitride ($SiN_x$) and the like.

The active layer AL is disposed on the first insulating layer 111. As an example, the active layer AL may include, but is not limited to, semiconductor material such as amorphous silicon and polycrystalline silicon, oxide and/or organic material.

The active layer AL includes a source region ALS, a middle (or central) region ALM and a drain region ALD. Each of the source region ALS and the drain region ALD is a conductive region through doping and is connected to a source electrode and a drain electrode, respectively. Doping may be performed by implanting n-type or p-type impurities into the active layer AL. For example, the n-type impurity may include, but is not limited to, Ge, Sn and/or the like, and the p-type impurity may include, but is not limited to, Mg, Zn, Be and/or the like.

The active layer AL has a width W (length in the direction of the Y-axis) larger than a length L (length in the direction of X-axis). The middle region ALM is a region to have a predetermined or selected length extended along the direction of the width (Y-axis direction). The active layer AL includes a plurality of active layer holes AHs on left and right sides in the X-axis direction with respect to the middle region ALM. The active layer holes AHs may be disposed symmetrically with respect to the middle region ALM. As an example, the active layer AL may include two or more holes AHs disposed along the X-axis direction and two or more active layer holes AHs disposed along the Y-axis direction, but is not limited thereto. The active layer hole AH may have, but is not limited to, a rectangular shape.

A second insulating layer 112 is disposed on the active layer AL. The second insulating layer 112 may be disposed over the whole area of the substrate 110 to insulate the active layer AL from the gate electrode GE. The second insulating layer 112 may have a single- or multi-layered structure of an inorganic insulating material such as silicon oxide ($SiO_x$) and/or silicon nitride ($SiN_x$) and the like.

The gate electrode GE is disposed over the second insulating layer 112. The gate electrode GE overlaps with or corresponds to the active layer AL and the bottom electrode BE. The gate electrode GE may be made of, but is not limited to, conductive material such as copper (Cu), aluminum (Al), molybdenum (Mo), nickel (Ni), titanium (Ti), chrome (Cr) and/or alloy thereof.

More particularly, the gate electrode GE overlaps with the whole middle area ALM and a part of the active layer hole AH of the active layer AL and a part, for example, a central area, of the bottom electrode BE. A channel may be formed in a region of the active layer AL overlapping with the gate electrode GE when driving the thin film transistor DT. The channel may be formed in a part of the middle region, which will be described in detail below.

A third insulating layer 113 is disposed on the gate electrode GE. The third insulating layer 113 may be disposed over the whole area of the substrate 110 to passivate components disposed under the third insulating layer 113. The third insulating layer 113 may have a single- or multi-layered structure of an inorganic insulating material such as silicon oxide ($SiO_x$) and/or silicon nitride ($SiN_x$) and the like.

Referring to FIG. 5, as described above, the channel region C may be formed in the region of the active layer AL overlapping with the gate electrode GE. The bottom electrode BE may be completely overlapped with the channel region C in order to prevent the lower portion of the channel region C from floating. The bottom electrode BE may be disposed to overlap with the gate electrode GE and to have a length L3 (FIG. 6) larger than a length L1 (FIG. 6) of the gate electrode GE.

The thin film transistor DT in accordance with one example embodiment of the present disclosure includes the bottom electrode BE disposed under the active layer AL with overlapping with the channel region C so that the channel can be distributed uniformly in case of driving the thin film transistor DT, and therefore, the thin film transistor DT can output stably the driving current.

Referring to FIG. 6, as described above, the active layer hole AH is arranged at each of the left side and the right side along the X-axis direction with respect to the middle region ALM. In the X-axis direction, the length L1 of the gate electrode GE is longer than the length L2 of the middle region ALM, and the edge of the gate electrode GE overlaps with or corresponds to the active layer holes AHs. In the X-axis direction, the length L3 of the bottom electrode BE is longer than the length L1 of the gate electrode GE and the edge of the bottom electrode BE overlaps with or corresponds to the active layer holes AHs. In other words, the edge of the bottom electrode BE is located outwardly to the edge of the gate electrode GE and is located correspondingly within the active layer holes AHs, and thus, stably potential environment around the channel region C can be established.

In addition, the bottom electrode BE does not overlap with the source region ALS and the drain region ALD of the active layer AL. For example, when the bottom electrode BE overlaps with the source region ALS and the drain region ALD of the active layer AL, parasitic capacitance between the bottom electrode BE and the active layer AL may be generated. The edge of the bottom electrode BE is located within two active layer holes AHs arranged along the X-axis direction in order to prevent such parasitic capacitance from generating.

The active layer AL includes plural active layer holes AHs, the edge of the bottom electrode BE is located outward to the edge of the gate electrode GE and is located within the active layer holes AHs in the thin film transistor DT in accordance with an example embodiment of the present disclosure. Accordingly, it is possible to establish stable potential environment around the channel region in driving the thin film transistor DT and to prevent parasitic capacitance from generating in the thin film transistor DT.

Figure 7:
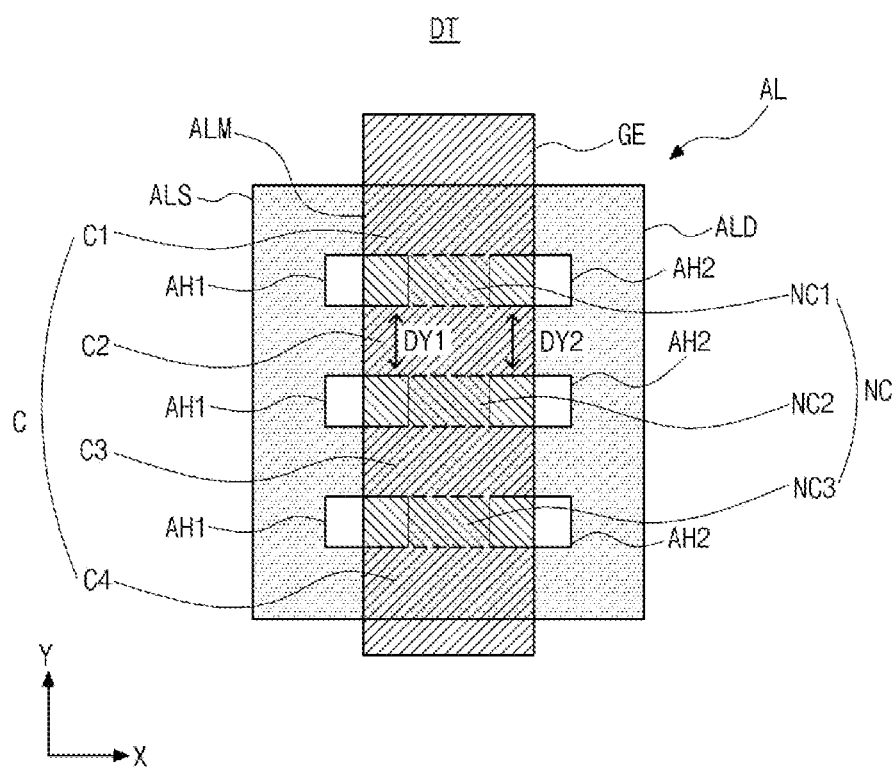
FIG. 7 is a plain view illustrating schematically a part of a thin film transistor in accordance with another example aspect of the present disclosure.

FIG. 7 is a plain view illustrating schematically a part of a thin film transistor in accordance with another example aspect of the present disclosure. For convenience of description, only the gate electrode GE and the active layer AL are illustrated in FIG. 7.

The active layer AL includes a plurality of active layer holes AH1 and AH2. The plural active layer holes include a first active layer hole AH1 arranged parallel along the Y-axis direction at the left side with respect to the middle region ALM, and a second active layer hole AH2 arranged parallel along the Y-axis direction at the right side with respect to the middle region ALM. In FIG. 7, while each of the first active layer hole AH1 and the second active layer hole AH2 includes three active layer holes, the number of active layer holes disposed in the Y-axis direction is not limited thereto. In addition, the first active layer hole AH1 and the second active layer hole AH2 have the same shape and spaced apart from each other by a predetermined or selected distance along the X-axis direction and are arranged parallel to each other. For example, the first active layer hole AH1 and the second active layer hole AH2 may have, but is not limited to, a rectangular shape.

When the thin film transistor DT is driven, a channel region C is formed in the active layer AL, and particularly, the channel region C is formed in a region where the active layer hole AH is not disposed on a moving line through which carriers move along the X-axis direction. The channel region C is formed in a region overlapping with the gate electrode GE in the active layer AL, and the channel region C may include a first channel region C1, a second channel region C2, a third channel region C3 and a fourth channel region C4. The number of the channel regions Cs may be changed depending on the number of the active layer holes AH1 and AH2 arranged in the Y-axis direction.

The first active layer holes AHls arranged in the Y-axis direction are spaced apart from each other with the same first distance DY1, and the second active layer holes AH2s arranged in the Y-axis direction are spaced apart from each other with the same second distance DY2, and the first distance DY1 and the second distance DY2 are equal to each other. Therefore, the first channel region C1, the second channel region C2, the third channel region C3 and the fourth channel region C4 have the same width, and each channel region C becomes a passage through which the same amount of carriers can travel.

On the other hand, a channel is not formed between the first active layer hole AH1 and the second active layer hole AH2 in the active layer AL. In other words, the active layer AL includes non-channel region NC in which channels are not formed between the channel regions C. The non-channel region NC includes a first non-channel region NC1 between the first channel region C1 and the second channel region C2, a second non-channel region NC2 between the second channel region C2 and the third channel region C3, and a third non-channel region NC3 between the third channel region C3 and the fourth channel region C4. In other words, the channel regions C and the non-channel regions NCs are alternately arranged, and the number of the channel regions Cs is larger than the number of the non-channel regions NCs, and/or the width of the channel region C is wider than the width of the non-channel region NC, so that a path through which the carrier moves can be secured.

Referring to FIGS. 4 and 7, the middle region ALM includes a plurality of channel regions Cs and a plurality of non-channel regions NCs. The active layer AL includes the middle region ALM with the plural non-channel regions NCs so that it is possible to prevent loss of driving current in the thin film transistor DT and to secure a path through which heat can be dissipated or emitted. In addition, the non-channel region NC allows the step difference between the channel regions Cs to be reduced and the thin film transistor DT to output the driving current stably.

The thin film transistor DT in accordance with another example embodiment of the present disclosure includes an active layer AL in which the first active layer hole AH1 and the second active layer hole AH2 with the same shape and the same spaced distance are formed. The thin film transistor DT can form uniform channel regions C, prevent loss of the driving current and secure a thermal dissipation path.

Figure 8:
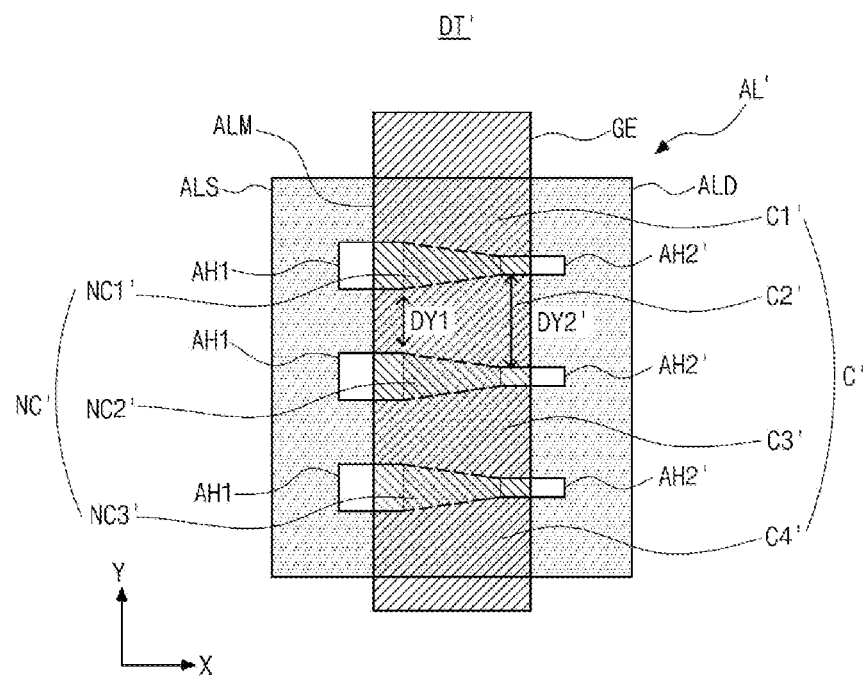
FIG. 8 is a plain view illustrating schematically a part of a thin film transistor in accordance with still another example aspect of the present disclosure.

FIG. 8 is a plain view illustrating schematically a part of a thin film transistor in accordance with still another example aspect of the present disclosure. For convenience of description, only the gate electrode GE and the active layer AL' are illustrated in FIG. 8.

The active layer AL' includes a first active layer hole AH1 and a second active layer hole AH2'. The first active layer hole AH1 and the second active layer hole AH2' are arranged parallel along the X-axis direction with spaced apart from each other with a predetermined or selected distance. For example, the first active layer hole AH1 and the second active layer hole AH2' may have a rectangular shape with different widths (sizes in the Y-axis direction). More particularly, the second active layer hole AH2' arranged in the drain region ALD may have a width smaller than a width of the first active layer hole AH1 arranged in the source region ALS.

In this case, the first active layer holes AHls arranged along the Y-axis direction are spaced apart from each other with the same spaced distance of a first distance DY1 and the second active layer holes AH2s arranged along the Y-axis direction are spaced apart from each other with the same spaced distance of a second distance DY2'. The first distance DY1 is different from the second distance DY2'. More particularly, the second distance DY2' is larger than the first distance DY1.

The active layer AL' includes a first channel region C1', a second channel region C2', a third channel region C3' and a fourth channel region C4'. The width of each of the first channel region C1', the second channel region C2', the third channel region C3' and the fourth channel region C4' is wider gradually from the source region ALS to the drain region ALD. Accordingly, it is possible to improve the reliability of the thin film transistor DT' by reducing a phenomenon in which current is concentrated in the drain region ALD when the channel widths are the same in the whole area.

The active layer AL' includes a non-channel region NC' where the channel is not formed between the channel regions C's. The non-channel region NC' includes a first non-channel region NC1' between the first channel region C1' and the second channel region C2', a second non-channel region NC2' between the second channel region C2' and the third channel region C3', and a third non-channel region NC3' between the third channel region C3' and the fourth channel region C4'.

Referring to FIG. 8, the middle region ALM includes a plurality of channel regions C's and a plurality of non-channel regions NC's. The middle region ALM of the thin film transistor DT' in accordance with still another example aspect of the present disclosure is identical with the middle region ALM of the previous aspect except that the size of the channel region C' and the non-channel region NC' in the middle region ALM. The active layer AL' with the middle region ALM can secure the non-channel region NC', and therefore, it is possible to prevent loss of the driving current in the thin film transistor DT' and to secure the path through which heat can be dissipated.

In addition, the non-channel region NC' allows the step difference between the channel regions C' to be reduced and the thin film transistor DT' to output a driving current stably. The thin film transistor DT' in accordance with still another example aspect of the present disclosure includes the active layer AL' with the second active layer hole AH2' disposed in the drain region ALD and the first active layer hole AH1 disposed in the source region ALS in which the width of the second active layer hole AH2' is smaller than the width of the first active layer hole AH1, so that the thin film transistor DT' can form uniform channel regions C's, prevent a loss of driving current and establish a heat dissipation path.

Figure 9:
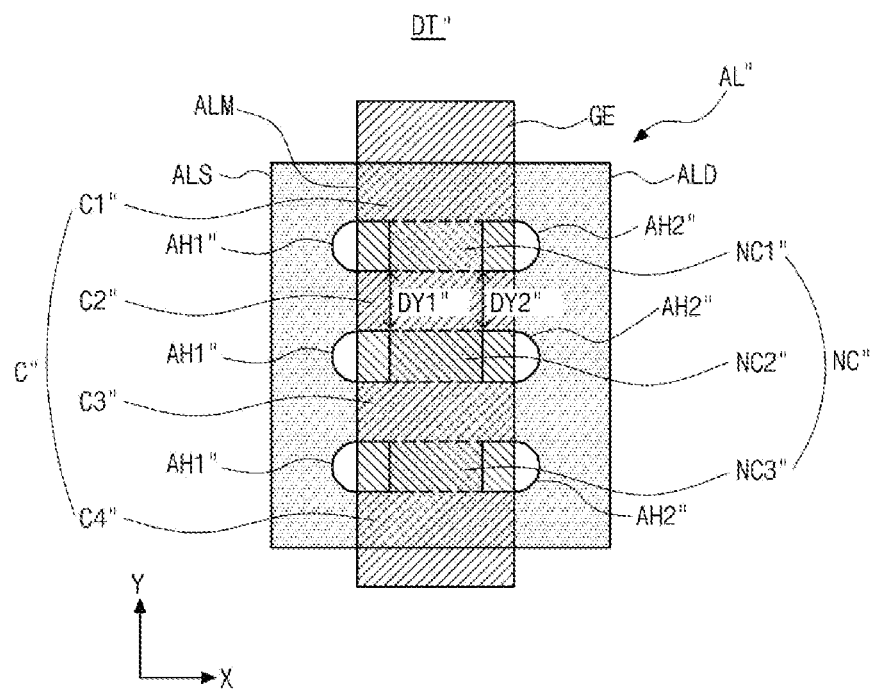
FIG. 9 is a plain view illustrating schematically a part of a thin film transistor in accordance with further still another example aspect of the present disclosure.

FIG. 9 is a plain view illustrating schematically a part of a thin film transistor in accordance with further still another example aspect of the present disclosure. For convenience of description, only the gate electrode GE and the active layer AL" are illustrated in FIG. 9.

The active layer AL" includes a first active layer hole AH1" and a second active layer hole AH2". The first active layer hole AH1" and the second active layer hole AH2" are disposed symmetrically with respect to the middle region ALM and arranged parallel to the X-axis direction, spaced apart from each other with a predetermined or selected distance. The first active layer hole AH1" and the second active layer hole AH2" each have a shape with at least one curved plane, for example, but not limited to, an elongated semicircular shape.

The active layer AL" includes a first channel region C1", a second channel region C2", a third channel region C3" and a fourth channel region C4". The first active layer holes AH1"s arranged along the Y-axis direction is spaced apart from each other with the same distance DY1", and the second active layer holes AH2"s arranged along the Y-axis direction is spaced apart from each other with the same distance DY2". The first distance DY1" may be equal to the second distance DY2". Accordingly, the first channel region C1", the second channel region C2", the third channel region C3" and the fourth channel region C4" have the same widths, and each channel region becomes a passage through which the same amount of carriers can travel.

In addition, the active layer AL" includes a non-channel region NC" in which the channel is not formed. The non-channel region NC" includes a first non-channel region NC1" between the first channel region C1" and the second channel region C2", a second non-channel region NC2" between the second channel region C2" and the third channel region C3", and a third non-channel region NC3" between the third channel region C3" and the fourth channel region C4".

With referring to FIG. 9, the middle region ALM includes a plurality of channel regions C"s and a plurality of non-channel regions NC"s. The middle region ALM allows the active layer AL" to secure the non-channel region NC", to prevent a loss of driving current of the thin film transistor DT", and to establish a path through which heat can be dissipated. In addition, the non-channel region C" enables the step difference between the channel region C" to be reduces, and the thin film transistor to output the driving current stably.

The thin film transistor DT" in accordance with still another example aspect of the present disclosure includes the active layer AL" with the first active layer hole AH1" and the second active layer hole AH2" which are disposed symmetrically with respect to the middle region ALM and each of which is spaced apart from with the same distance. Accordingly, it is possible to form a uniform channel region C", to prevent a loss of the driving current, and to secure a heat dissipation path.

In accordance with one aspect, a display panel includes: a substrate; an active layer disposed over the substrate, the active layer including a source region, a drain region and a middle region between the source region and the drain region; and a gate electrode over the active layer and disposed overlapping with the middle region. The active layer includes plural holes (also called active holes) disposed symmetrically with respect to the middle region. The plural holes in the display panel can secure the heat dissipation path, and thus, improve its reliability.

The holes may be provided between the middle region and the source region and/or between the middle region and the drain region. The source region, the middle region and the drain region may be disposed one after the other in a first direction (i.e. x-direction). The gate electrode may extend in a second direction (i.e. y-direction). The holes may be disposed symmetrically with respect to an axis in a second direction (i.e. y-direction). The second direction may be perpendicular to the first direction. A plurality of holes may be arranged one after the other in the second direction. The plurality of holes may include two columns of holes, the second direction being the direction in which the columns extend.

As an example, the display panel may further include a bottom electrode disposed between the substrate and the active layer. A bottom electrode may be disposed between the substrate and the middle region of the active layer. A width of the bottom electrode may be larger than a width of the gate electrode. In addition, lateral edges of the bottom electrode may overlap with the plural holes. That is, the plurality of holes is arranged to overlap with edges of the bottom electrode, i.e. each hole may be disposed to face and/or overlap an edge of the bottom electrode. A left edge and a right edge of the bottom electrode may overlap with, or correspond to an interior of the plural holes. Here, width may be in a first direction (i.e. x-direction) in which the source region, the middle region and the drain region are disposed one after the other.

Alternatively, the middle region may be disposed between the plural holes. The plurality of holes may be provided in two columns with the middle region in between.

In accordance with an example embodiment, the active layer may further include plural channel regions between the source region and the drain region. The middle region may connect the plural channel regions. That is, the active layer may further include a plurality of channel regions arranged in the second direction.

In accordance with still another example embodiment, the middle region may be disposed between the source region and the drain region and may include plural channel regions and plural non-channel regions. Each of the non-channel regions may be disposed between two of the plurality of holes. The channel regions and the non-channel regions may be alternately disposed in the second direction. Optionally, each of the non-channel regions may be between two of the holes that are disposed symmetrically with respect to the middle region, and may space two adjacent ones of the channel regions apart.

In accordance with further still another example embodiment, the active layer and the gate electrode may constitute or may be part of a driving element, e.g. a driving thin film transistor. The display panel may further include an electroluminescence element electrically connected to the driving element. The driving element constituted by or having the active layer which includes plural holes disposed symmetrically with respect to the middle region can generate high driving current.

In accordance with further still another example embodiment, the plural holes may include a first hole with a first size and a second hole with a second size different from the first size. The first hole and the second hole may be arranged on opposite sides of the middle region, e.g. may be disposed facing each other with the middle region in between. The first hole and the second hole may be arranged parallel along a first direction. The first hole may be disposed closer to the source region than the drain region and the second hole may be disposed closer to the drain region than the source region. In addition, a size of the second hole may be smaller than a size of the first hole in a second direction perpendicular to the first direction. That is, a first length of the first hole may be larger than a second length of the second hole. Here, a length may be measured in the second direction perpendicular to the first direction. Optionally, a plurality of the first holes may be spaced apart from each other with a first predetermined or selected distance, a plurality of the second holes may be spaced apart from each other with a second predetermined or selected distance, and each of the first holes and a corresponding one of the second holes may be disposed symmetrically with respect to the middle region and spaced apart from each other with a third predetermined or selected distance.

In another aspect, a thin film transistor may include an active layer including a source region, a drain region, at least two channel regions and a non-channel region, a gate electrode disposed over the active layer and overlapping with the channel region and the non-channel region, a source electrode electrically connected to the source region, and a drain electrode electrically connected to the drain region. The channel regions and the non-channel region may be arranged alternately. That is, the non-channel region may be disposed between the two channel regions. Accordingly, the thin film transistor can generate high driving current due to the at least two channel regions. Also, a display panel including the thin film transistor is provided.

In accordance with one example embodiment, the active layer may include plural holes disposed at both sides of the non-channel region. In addition, the plural holes may include at least one curved surface or curved portion, e.g. a circular, semicircular, oval or semioval shape or portion. The plural holes may have a curved shape, e.g. a circular or oval shape. Each of the plurality of holes may have the same size.

The plurality of holes may include a first hole and a second hole with the same size, the first hole and the second hole being arranged on different sides of the non-channel region. Alternatively, the plural holes may include a first hole with a first size and a second hole with a second size different from the first size.

In accordance with another example embodiment, the channel region between the source region and the drain region may have a width that increases or becomes gradually wider from the source region to the drain region.

In still another example embodiment, a number of the channel region may be larger than a number of the non-channel region.

In still another example embodiment, a width of the channel region may be wider than a width of the non-channel region.

In further still another example embodiment, a width of the active layer, i.e. in the first direction, may be larger than a length of the active layer, i.e. in the second direction.

In further still another example embodiment, a plurality of the non-channel regions may have a same shape and be spaced apart from each other with a predetermined or selected distance.

While the various aspects and embodiments of the present disclosure have been described in more detail with reference to the accompanying drawings, the present disclosure is not necessarily limited to those embodiments and aspects, and various modifications may be made within the scope of the present disclosure without departing from the spirit of the present disclosure. Accordingly, the embodiments disclosed in the present disclosure are not intended to limit the scope of the present disclosure, but is presented for the purpose of the description of the present disclosure, and the scope of the present disclosure is not limited by those embodiments. Therefore, it should be understood that the embodiments described above are illustrative in all aspects and not restrictive. The scope of the present disclosure should be interpreted by the claims, and all technical ideas within the scope equivalent thereto should be interpreted as being included in the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display panel including:
   a substrate including a display area and a non-display area;
   a plurality of pixels on the substrate in the display area;
   an active layer disposed over the substrate, the active layer including a source region, a drain region and a middle region between the source region and the drain region; and a gate electrode over the active layer and disposed overlapping with the middle region, wherein the active layer includes a plurality of holes disposed symmetrically with respect to the middle region, wherein each of the plurality of pixels includes a plurality of power lines and a plurality of data lines both extending along a first direction, and a plurality of gate lines extending along a second direction, wherein each of the plurality of pixels includes a plurality of sub-pixels and a plurality of redundancy sub-pixels configured to emit at least two colors of light, and wherein each of the plurality of power lines is arranged in each of the plurality of sub-pixels and in each of the plurality of redundancy sub-pixels, respectively.

2. The display panel of claim 1, wherein the middle region is disposed between the plurality of holes.

3. The display panel of claim 1, wherein the middle region is disposed between the source region and the drain region and includes a plurality of channel regions and a plurality of non-channel regions.

4. The display panel of claim 1, wherein the active layer and the gate electrode belong to a driving element, and the display panel further includes an electro-luminescence element electrically connected to the driving element.

5. The display panel of claim 1, wherein each of the plurality of sub-pixels and each of the plurality of redundancy sub-pixels configured to emit an identical color are arranged along the first direction.

6. The display panel of claim 1, wherein the active layer further includes a plurality of channel regions disposed between the source region and the drain region.

7. The display panel of claim 6, wherein the middle region connects the plurality of channel regions to each other.

8. The display panel of claim 1, further including a bottom electrode disposed between the substrate and the active layer.

9. The display panel of claim 8, wherein a width of the bottom electrode is larger than a width of the gate electrode.

10. The display panel of claim 9, wherein a left edge and a right edge of the bottom electrode overlap with an interior of the plurality of holes.

11. The display panel of claim 1, wherein each of the plurality of holes includes a first hole having a first size and a second hole having a second size different from the first size.

12. The display panel of claim 11, wherein the first hole and the second hole are arranged parallel along a first direction, wherein the first hole is disposed closer to the source region than to the drain region, and wherein the second hole is disposed closer to the drain region than to the source region.

13. The display panel of claim 12, wherein a size of the second hole is smaller than a size of the first hole in a second direction perpendicular to the first direction.

14. A thin film transistor including:
  an active layer including a source region, a drain region, at least two channel regions and a non-channel region;
  a gate electrode disposed over the active layer and overlapping with the channel regions and the non-channel region;
  a source electrode electrically connected to the source region; and
  a drain electrode electrically connected to the drain region,
  wherein the channel regions and the non-channel region are arranged alternately, and
  wherein the channel region between the source region and the drain region has a width that increases from the source region toward the drain region.

15. The thin film transistor of claim 14, wherein a number of the channel regions is larger than a number of the non-channel region.

16. The thin film transistor of claim 14, wherein a width of each of the channel regions is wider than a width of the non-channel region.

17. The thin film transistor of claim 14, wherein a width of the active layer is larger than a length of the active layer.

18. The thin film transistor of claim 14, wherein the active layer includes a plurality of holes disposed at both sides of the non-channel region.

19. The thin film transistor of claim 18, wherein each of the plurality of holes includes a first hole having a first size and a second hole having a second size different from the first size.

20. The thin film transistor of claim 18, wherein each of the plurality of holes has a curved shape.

* * * * *